US007573414B2

(12) United States Patent
Kumar et al.

(10) Patent No.: US 7,573,414 B2
(45) Date of Patent: Aug. 11, 2009

(54) MAINTAINING A REFERENCE VOLTAGE CONSTANT AGAINST LOAD VARIATIONS

(75) Inventors: Abhaya Kumar, Bangalore (IN); Visvesvarya Pentakota, Bangalore (IN); Nitin Agarwal, Bangalore (IN); Jagannathan Venkataraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/951,348

(22) Filed: Dec. 6, 2007

(65) Prior Publication Data

US 2009/0146857 A1 Jun. 11, 2009

(51) Int. Cl.
*H03M 1/12* (2006.01)

(52) U.S. Cl. ...................................... 341/155; 341/161

(58) Field of Classification Search ................. 341/155, 341/161, 154; 327/541
See application file for complete search history.

(56) References Cited

U.S. PATENT DOCUMENTS

| | | | | |
|---|---|---|---|---|
| 6,417,725 B1 * | 7/2002 | Aram et al. | ................. | 327/541 |
| 6,753,801 B2 * | 6/2004 | Rossi | ......................... | 341/161 |
| 6,933,874 B2 * | 8/2005 | Pentakota | ................... | 341/154 |
| 7,009,549 B1 * | 3/2006 | Corsi | ......................... | 341/161 |
| 2004/0160351 A1 * | 8/2004 | Rossi | ......................... | 341/161 |

* cited by examiner

*Primary Examiner*—Jean B Jeanglaude
(74) *Attorney, Agent, or Firm*—John J. Patti; Wade J. Brady, III; Frederick J. Telecky, Jr.

(57) ABSTRACT

A voltage source providing a constant reference voltage, independent of load variations at an output terminal. The effective impedance (looking-in impedance) at the output terminal is designed to be independent of frequency of the signals at the output terminal. In an embodiment, the resistance of one of two parallel impedance paths constituting the effective impedance is made equal to the resistance of the other path, and the time constants of both paths are made equal. As a result, the effective impedance is made independent of frequency, and the strength of the reference voltage is maintained constant without exhibiting ringing, DC droop, etc., despite load variations.

11 Claims, 5 Drawing Sheets

MAINTAINING A REFERENCE VOLTAGE CONSTANT AGAINST LOAD VARIATIONS

BACKGROUND

1. Field of the Invention

The present invention relates generally to circuits generating reference voltages, and more specifically to techniques for maintaining a reference voltage constant against load variations.

2. Related Art

Devices/systems often require a reference voltage to be supplied for operation. For example, an analog to digital converter often compares a strength (e.g., voltage) of an input signal with a fixed voltage to generate a corresponding digital code representing the strength of the input signal. Such fixed voltages supplied from a voltage source to external components are referred to as reference voltages.

One or more corresponding circuit portions of a device/system receiving a reference voltage act as a load (impedance) to a voltage source providing the reference voltage, and may draw current from the source. For example, in a pipeline ADC using switched capacitor circuits internally, capacitor banks act as a load to a voltage source providing the reference voltage.

The load impedance presented to a voltage source often changes with time. As a result, at least at time points when the load changes, the strength of the reference voltage may deviate from the desired reference level, often exhibiting overshoot/undershoot, ringing, DC offset (droop), etc., which may be undesirable.

Several aspects of the present invention provide a reference voltage which is maintained constant against such load variations.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A voltage source providing a constant reference voltage, independent of load variations at an output terminal. The effective impedance (looking-in impedance) at the output terminal is designed to be independent of frequency of the signals at the output terminal. In an embodiment, the resistance of one of two parallel impedance paths constituting the effective impedance is made equal to the resistance of the other path, and the time constants of both paths are made equal. As a result, the effective impedance is made independent of frequency, and the strength of the reference voltage is maintained constant without exhibiting ringing, DC droop, etc., despite load variations.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
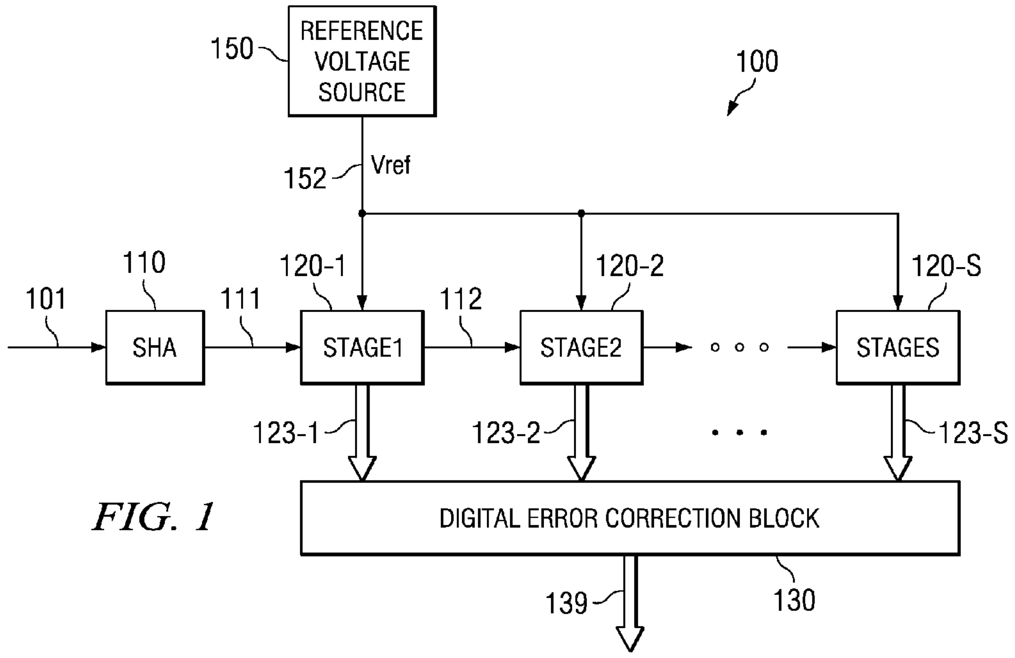
FIG. 1 is a block diagram illustrating the details of an example device in which several aspects of the present invention can be implemented.

FIG. 1 is a block diagram illustrating the details of an example component in which several aspects of the present invention can be implemented. Pipeline ADC 100 is shown containing sample and hold amplifier (SHA) 110, stages 120-1 through 120-S, digital error correction block 130, and reference voltage source 150. Each block is described below in further detail.

SHA 110 samples the input signal received on path 101 and holds the sampled voltage level of the sample on path 111 for further processing.

Digital error correction block 130 receives sub-codes from various stages (on paths 123-1 through 123-S respectively), and generates a digital code representing the strength of a corresponding sample of the input signal received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Each stage 120-1 through 120-S generates a sub-code corresponding to a voltage level of a signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2.

Reference voltage source 150 provides a voltage output 152 (reference voltage designated in the Figure as Vref) which is connected to (corresponding internal circuitry in) stages 120-1 through 120-S. Each of stages 120-1 through 120-S may compare the corresponding input signal with Vref 152 in generating the respective digital codes noted above.

Figure 2:
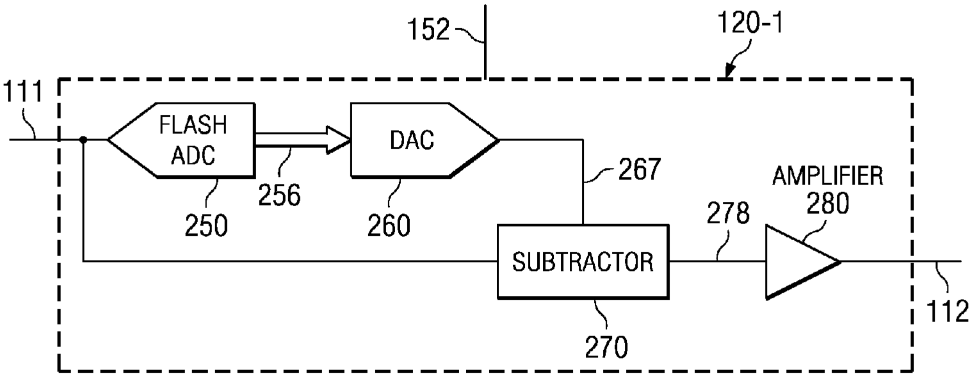
FIG. 2 illustrates the logical operation of a stage of a pipeline ADC.

FIG. 2 further illustrates the logical operation of a stage (described with reference to stage 120-1 only, for conciseness) of pipeline ADC 100 according to a known approach.

With respect to FIG. 2, stage 120-1 is shown containing flash ADC 250, digital to analog converter (DAC) 260, subtractor 270 and amplifier 280. Flash ADC 250 (an example of a sub ADC) converts a sample of an analog signal received on path 111 into a corresponding P-bit sub-code provided on path 256 (contained in path 123-1 of FIG. 1, and P is less than N, where N is the number of bits in the final digital code provided on path 139 of FIG. 1).

DAC 260 converts the sub-code received on path 256 into corresponding analog signal (Vdac) on path 267. Vdac is generally proportionate to the sub-code and represents the analog equivalent of the resolved sub-code, as is well known in the relevant arts.

Subtractor 270 generates a residue signal as the difference of sample 111 (Vi) and the analog signal received on path 267. Amplifier 280 amplifies the residue signal (Vi-Vdac) which is then provided on path 112 as an amplified residue signal. The signal on path 112 is used to resolve the remaining bits in the N-bit digital code by the subsequent stages of the ADC.

Vref 152 is provided to stage 120-1 for the operation of respective circuitry within the stage. Such circuitry presents a variable load to Vref 152, as may be better understood from a brief description of the internal details of stage 120-1 in one implementation.

3. Variable Load Presented to a Reference Voltage

Figure 3:
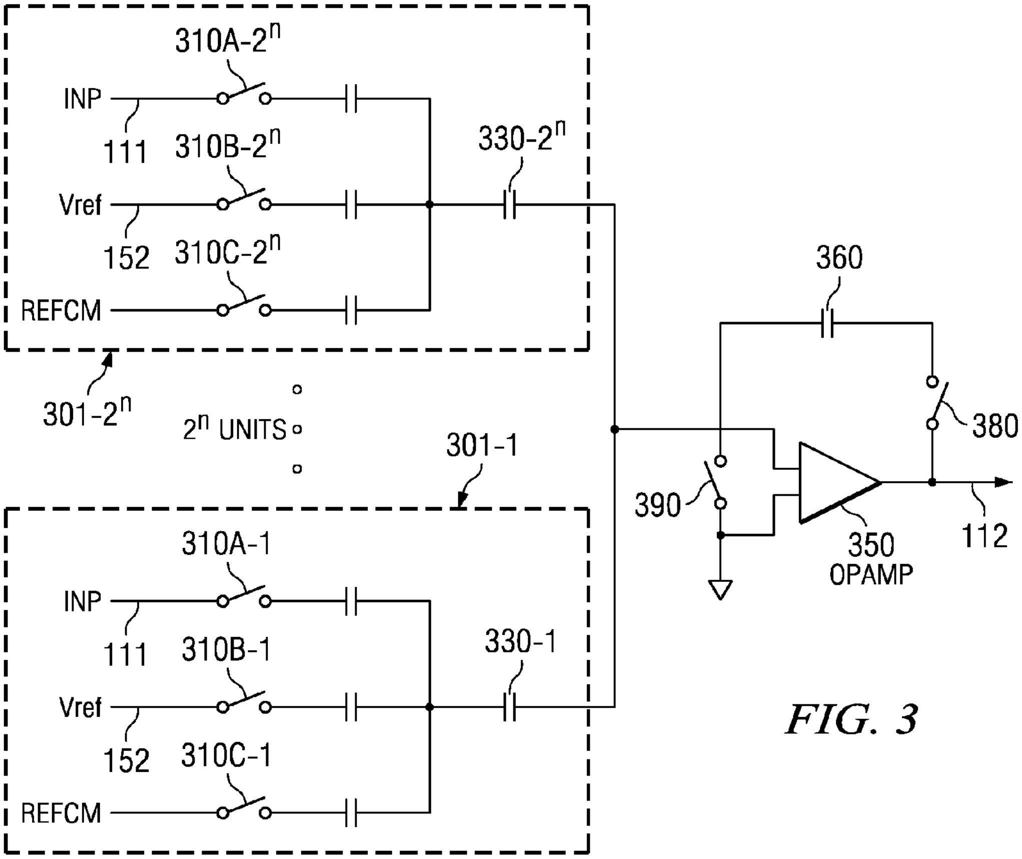
FIG. 3 is a circuit diagram illustrating the manner in which a DAC, subtractor and amplifier used in a stage of pipeline ADC are implemented in an embodiment.

FIG. 3 is a circuit diagram illustrating the manner in which DAC 260, subtractor 270, and gain amplifier 280 are implemented in an embodiment. The circuit diagram is shown containing op-amp 350, feedback capacitor 360, feedback switch 380 and circuit portions 301-1 through 301-2*n*. The circuit is referred to as a gain (or residue amplification) block and operates to provide the function of components DAC 260, subtractor 270 and amplifier 280. FIG. 3 shows a gain stage in a single ended implementation, but equivalent embodiments can be implemented in differential form also in known way.

Circuit portion 301-1 is shown containing sampling capacitor 330-1, switch 310A-1, 31OB-1 and 310C-1. The remaining circuit portions 310-2 through 310-2*n* may also contain similar components, and are not shown/described in the interest of conciseness.

In operation, during a first (e.g., sampling) phase switches 310A-1 through 310A-2*n* and switch 390 are closed, while switches 380, 310B-1 through 310B-2*n,* and 310C-1 through 310C-2*n* are kept open. As a result, each sampling (input) capacitor 330-1 through 330-2*n* is ideally charged to the voltage of input sample received on path 111. During a next (e.g., hold) phase, feedback switch 380 is closed, and switches 310A-1 through 310A-2*n* as well as switch 390 are kept open.

Connections of switches 310B-1 through 310B-2*n,* and 310C-1 through 310C-2*n* are made such that the input terminals of each sampling capacitors 330-1 through 330-2*n* is connected either to Vref (reference voltage received on path 152) or to REFCM terminal (which provides a common mode reference voltage), based on the corresponding output bits of comparators used in flash ADC 250. Each switch pair (such as switch pair 310B-1/310-1) may be controlled by an output bit from a corresponding comparator used in flash ADC 250.

As a result, capacitors 330-1 through 330-2*n* transfer a charge proportional to the difference (residue) of input signal and Vref or REFCM to feedback capacitor 360. The residue is amplified by op-amp 350 and provided as amplified residue signal to the next stage, as desired.

Thus, it may be appreciated that whether Vref is connected or not to (specific ones of) capacitors 330-1 through 330-2*n* depends on the corresponding output bits of comparators used in flash ADC 250. In general, which ones of capacitors 330-1 through 330-2*n* is connected to Vref during a hold phase depends on the strength of the sample of input signal 111 at the corresponding sampling instant/interval. The load (impedance) presented to reference voltage source 150 may, therefore, vary with time (varying load).

In general, the largest change in load occurs from "no-load" to "full-load". In the above example, such a change occurs when Vref was previously not connected to any of the capacitors 330-1 through 330-2*n,* but is connected during a "present" hold phase to all of capacitors 330-1 through 330-2*n.*

As is well known, load variations in general cause the strength of the reference voltage to deviate from the desired reference level, often exhibiting overshoot/undershoot, ringing, DC offset (termed droop), etc, which may be undesirable.

A reference voltage source provided according to an aspect of the present invention reduces such effects as described below with examples.

4. Reference Voltage Source

Figure 4:
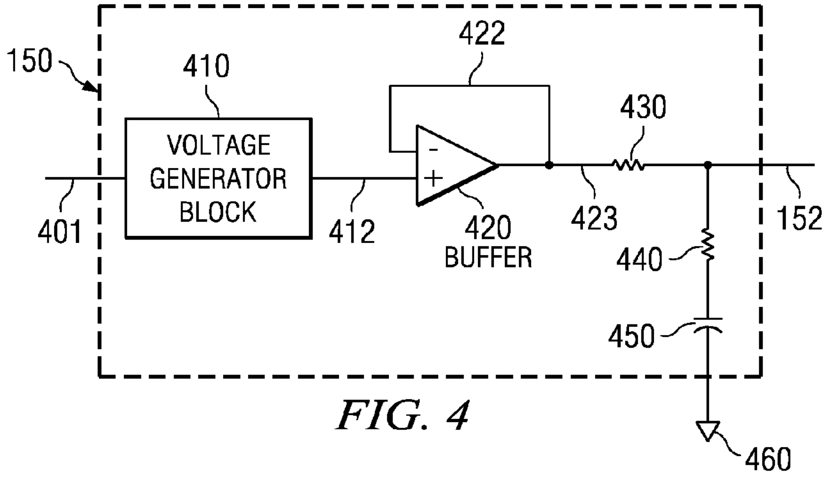
FIG. 4 is a block diagram of partial internal details of a reference voltage source in an embodiment.

FIG. 4 is a block diagram of partial internal details of reference voltage source 150 in an embodiment. Reference voltage source 150 is shown containing voltage generator block 410, buffer 420, resistors 430 and 440 and capacitor 450.

Voltage generator block 450 receives a power supply voltage on path/node 401, and generates a fixed voltage on path/node 412. The power supply voltage may correspond to a DC signal. Voltage generator block 450 can be implemented using various well known techniques such as band gap reference, etc., well known in the relevant arts.

Buffer amplifier 420 may be configured as a unity gain non-inverting amplifier (with path 422 representing the feedback path), and provides the fixed voltage received on path 412 with increased drive on path 423. In general, buffer amplifier 420 presents a high input impedance (to signal on path 412) and exhibits low output impedance (path 423).

Resistor 430 represents the sum of the output resistance of buffer amplifier 420 and the resistance of track/wiring from the output of buffer amplifier 420 to the output terminal 152.

Capacitor 450 represents the capacitance between the output terminal 152 and a reference terminal (usually ground 460), and may represent a sum of stray capacitance and one or more compensation capacitors (e.g., for decoupling the voltage on terminal 152 from the effects of changes in load connected to terminal 152 etc) provided at output terminal 152. Resistor 440 represents the effective series resistance (ESR) of capacitor 450.

An aspect of the present invention obtains constant voltage on path 152 by appropriate values (or magnitudes) for various components of FIG. 4. However, even without such appropriate values, some level of similar benefits may be obtained, as described below with respect to FIGS. 5A-6B. It should be appreciated that the prior approach as well as embodiments in accordance with the invention are both described with respect to FIG. 4 since both may use similar topology of components.

5. DC Droop Cancellation in a Prior Approach

Figure 5A:
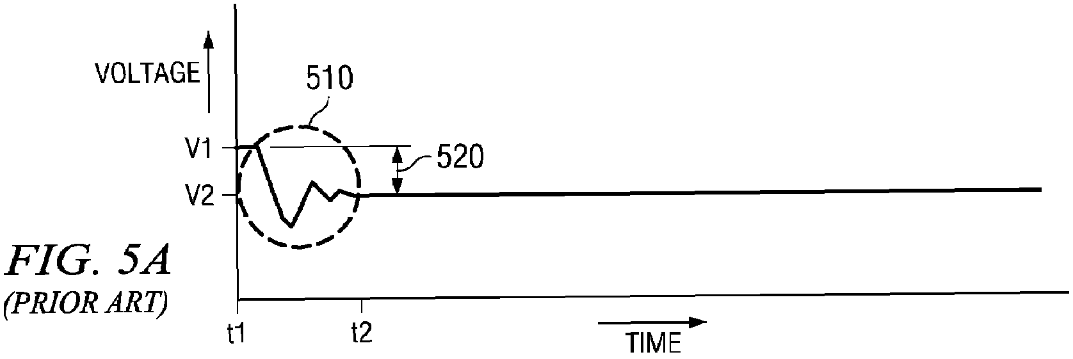
FIG. 5A (PRIOR ART)
FIGS. 5A and 5B are waveforms depicting effects of load variations on a reference voltage.

FIG. 5A is a waveform of reference voltage at terminal 152 in one prior embodiment in which resistor 430 (or the resistance thereof) is not equal to resistor 440 (but the magnitude of capacitor 450 is not controlled, as described in sections below with respect to inventive aspects). In the diagram it is assumed that the load presented to reference voltage 152 (Vref, assumed to have a desired value of V1 volts) is changed at time instance t1 from no-load (corresponding to none of capacitors 130-1 through 130-2*n* of FIG. 3 being connected to Vref) to full-load (corresponding to all of capacitors 130-1 through 130-2*n* being connected to Vref).

It may be observed from FIG. 5A that due to the load change, Vref exhibits transients/ringing (depicted by the region 510), which dies down by time instance t2. In addition, starting at time instance t2, Vref settles to a constant level V2 volts, which is less than the desired value V1. Thus, Vref also exhibits a DC level shift (droop), represented by 520 (V1-V2).

Figure 5B:
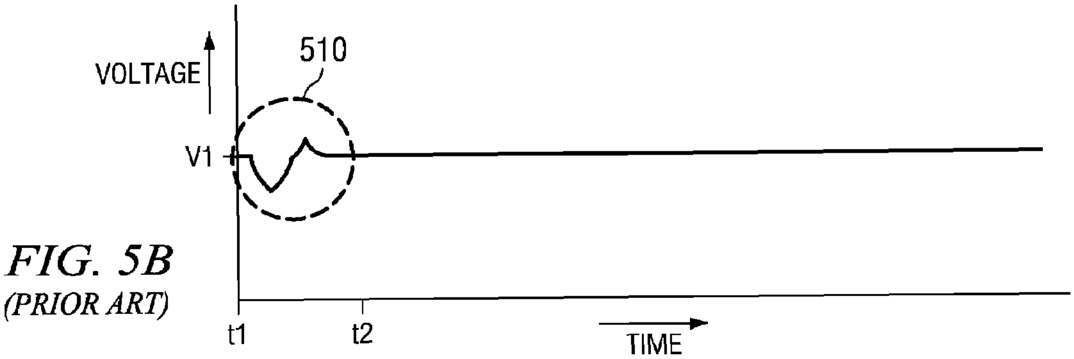
FIG. 5B (PRIOR ART)

A prior technique prevents DC droop by designing the value of resistor 430 to be equal to the value of resistor 440. As a result, the DC droop is prevented, as shown in FIG. 5B. However, Vref shown in FIG. 5B still exhibits ringing/oscillations in the region 510. (It is noted here that the waveforms of FIG. 5A and 5B represent the envelope of the reference voltage 152, i.e., voltage 152 may exhibit small variations, not shown, about the values shown in the Figures). Thus, if the transients/ringing are required to be minimized, buffer amplifier 420 may be required to be implemented as a high-speed, high-power amplifier, which may not be desirable.

Several aspects of the present invention enable reference voltage 152 to be provided without ringing/oscillations, DC droop and other undesirable effects as noted above, by appropriate properties for the combination of resistors 430/440, capacitor 450 and buffer 420. The general theoretical basis for such properties is described firth below.

6. Theoretical Basis

Referring to FIG. 4, the effective impedance (also termed looking-in impedance) at output terminal 152 is the impedance across output terminal 152 and reference (ground) terminal 460, considering all circuit portions (components) contained in reference voltage source 150.

Buffer amplifier 420 may be considered (modeled) as an inductance. As noted above, resistor 430 represents the sum of the output resistance of buffer amplifier 420 and the resistance of track/wiring from the output of buffer amplifier 420 to the output terminal 152.

Thus, the impedance of the signal path (first signal path) from node 412 to output terminal 152 may be expressed as:

$$Zfp=(R430+s*Lamp) \quad \text{Equation 1}$$

Wherein,

Zfp is the impedance of the signal path from node 412 to output terminal 152, R340 is the resistance of resistor 430, being the sum of the output resistance of buffer amplifier 420 and the resistance of track/wiring from the output of buffer amplifier 420 to the output terminal 152, Lamp is the inductance exhibited by buffer amplifier 420, s is the complex Laplace variable, It is noted here that buffer amplifier 420 is assumed to have a single dominant pole, i.e., higher order poles have negligible effect on the variations of Zfp with frequency.

The impedance due to resistor 440 and capacitor 450 (second signal path) may be expressed as:

$$Zsp=(R440+1/(s* C450) \quad \text{Equation 2}$$

It may be shown that the effective (looking-in) impedance at output terminal 152 is equal to the parallel combination of Zfp and Zsp of equations 1 and 2 respectively.

$$\text{Thus, } Zeff=(Zfp*Zsp)/(Zfp+Zsp) \quad \text{Equation 3}$$

Before continuing with the description related to invention aspects, the description is continued with respect to the behavior of the system with respect to the prior technique of FIG. 5B described above.

Figure 6A:
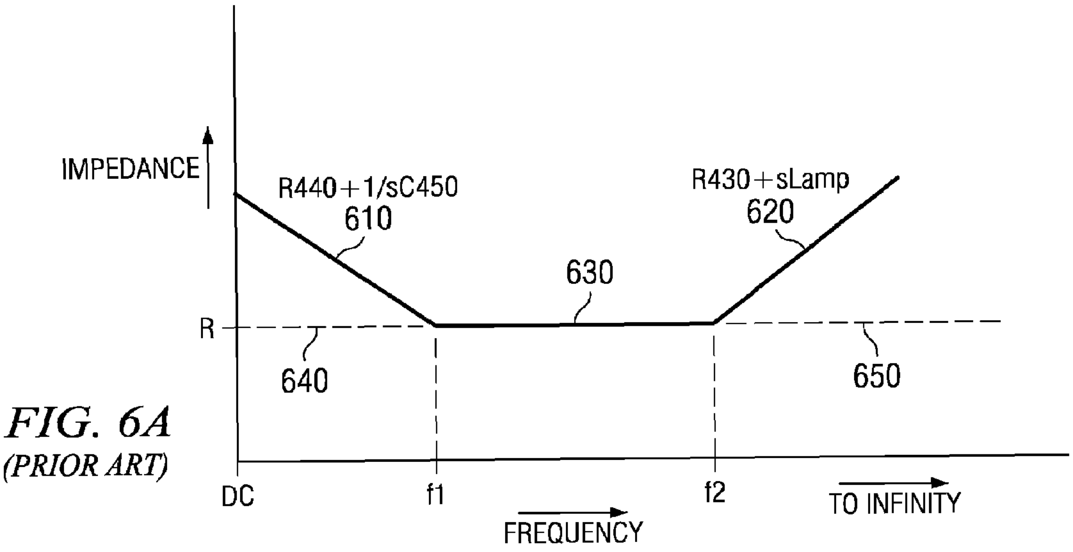
FIG. 6A (PRIOR ART)
FIGS. 6A and 6B are diagrams representing respectively the variations with frequency of impedances contributing to an effective impedance at an output terminal of a reference voltage source, and the effective impedance according to a prior technique.

FIG. 6A shows graphically the variation in the values of Zfp and Zsp with frequency in relation to the prior embodiment described above with respect to FIG. 5B. In FIG. 6A, lines 610, 630 and 650 together represent Zsp, while lines 640, 630 and 620 together represent Zfp, wherein it has been assumed that the value of R430 is equal to the value of R440, indicated by simply by 'R' in FIG. 6A. Thus, FIG. 6A represents the values of Zsp and Zfp in the prior technique described above.

It may be observed from FIG. 6A that Zsp has a cross-over frequency (3 dB corner frequency at which the value of Zsp falls within 3 decibels of the value represented by section 630) of f1 Hertz (Hz), while Zfp has a cross-over frequency (3 dB corner frequency at which the value of Zfp is greater than 3 decibels of the value represented by section 630) of f2 Hz.

Figure 6B:
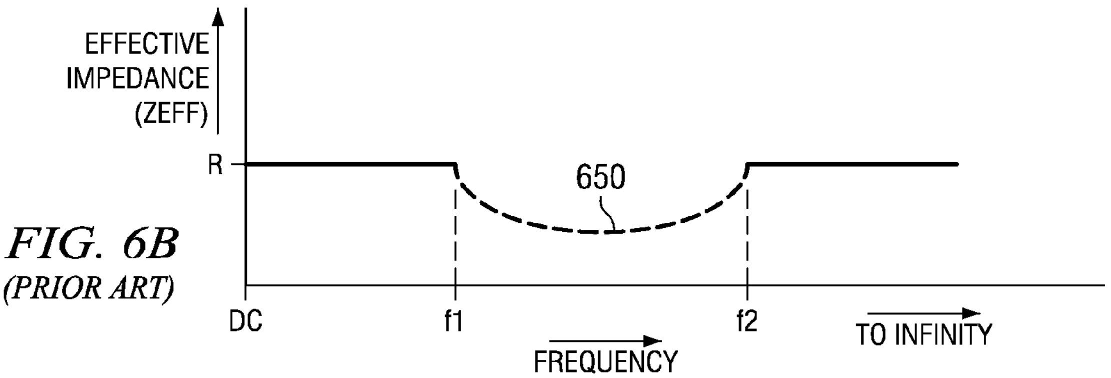
FIG. 6B (PRIOR ART)

Due to the parallel combination of Zsp and Zfp, it may be shown that Zeff has a frequency dependence as shown in FIG. 6B. It may be observed that Zeff has a constant value R (equal to the value of R430 or R440) from DC to f1 Hz, and for frequencies higher than f2 Hz. For frequencies between f1 Hz and f2 Hz, Zeff varies as shown by curved section 650. Therefore, while designing R430 to be equal to R440 in the prior technique eliminates DC droop as noted above, frequency dependence of Zeff still causes transients.

According to an aspect of the present invention, Zeff (effective looking-in impedance at the output terminal 152) is made independent of frequency to maintain reference voltage at terminal 152 constant despite load variations, and is described next.

7. Effective Impedance Made Independent of Frequency

According to an aspect of the present invention, corner frequencies f1 and f2 are made equal to render Zeff independent of frequency.

Thus, R430 is designed to be equal to R440 (as in the prior technique). In addition, corner frequencies f1 and f2 are made equal, by making the time constant of Zsp to be equal to the time constant of Zfp.

Thus, $$1/(R440 * C450)=R430/Lamp \quad \text{Equation 4}$$

Figure 7A:
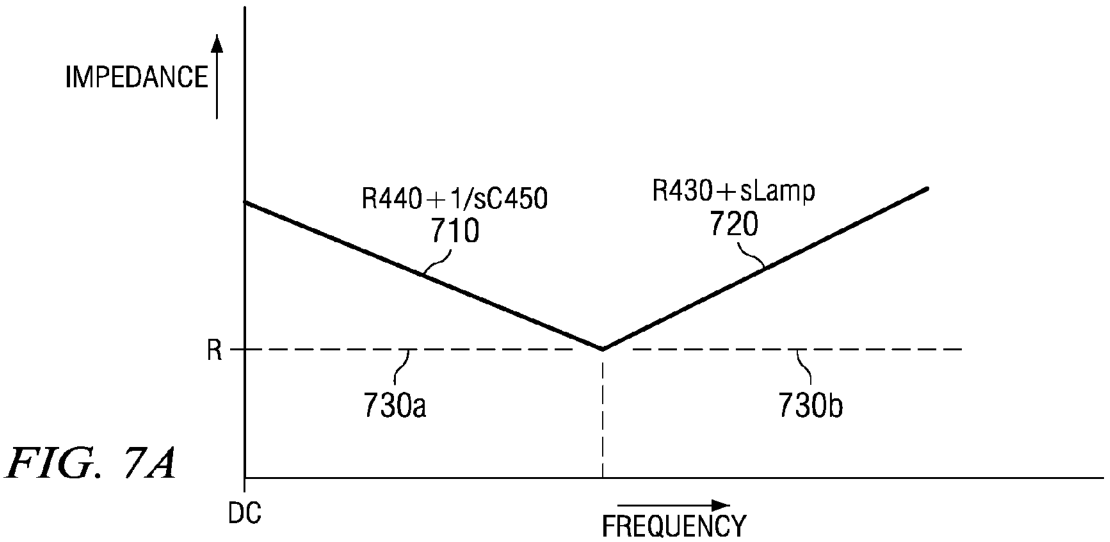
FIGS. 7A and 7B are diagrams representing respectively the variations with frequency of impedances contributing to an effective impedance at an output terminal of a reference voltage source, and the effective impedance according to an aspect of the present invention.

FIG. 7A shows graphically the resulting variation in the values of Zfp and Zsp with frequency when Equation 4 is satisfied. In FIG. 7A, lines 710 and 730*b* together represent Zsp, while lines 720 and 730*a* together represent Zfp, where it has been assumed that the value of R430 is equal to the value of R440, indicated by simply by 'R' in FIG. 6A.

Figure 7B:

The corresponding variations in the values of Zeff with frequency is shown in for FIG. 7B, from which it may be observed that Zeff has a constant value (equal to the value of R430 or R440) for all frequencies of signals at the output terminal 152.

Figure 8:
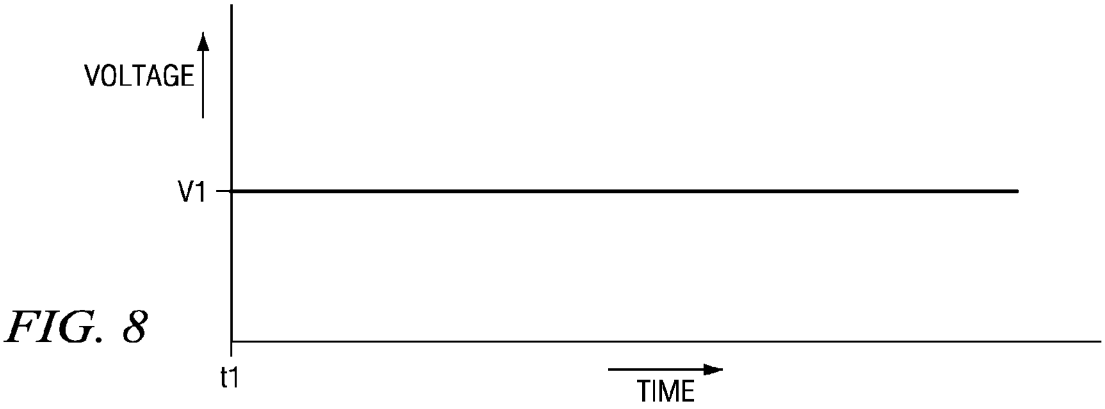
FIG. 8 is a diagram depicting effects of load variations on a reference voltage in an embodiment of the present invention.

As a result of the time constants of the impedance of the two signal paths being equal (in addition to the equal resistances of the two paths), reference voltage on output terminal 152 may show limited (low or 0) transient/ringing or DC droop, as shown in FIG. 8. (The waveform of FIG. 8 represents the envelope of the reference voltage 152, which may exhibit small variations (not shown in FIG. 8) about the values shown in the Figure).

R440 (ESR of C450) may be determined during layout of capacitor 450 on silicon. Similarly, R430 may be determined from knowledge of the output resistance of buffer amplifier 420 (from design) and resistance of the track/wiring from output of buffer amplifier 420 to the output terminal 152.

The value of Lamp may be determined based on the desired characteristics of buffer 420 (selected by the designer), according to techniques well known in the relevant arts. In an embodiment, the looking-in impedance at the output of buffer 420 (i.e., at terminal 152, but ignoring the effects of resistor 440 and capacitor 450, and any other components (including stray effects) in reference voltage source 150 is expressible by the following equation:

$$Zamp=Rwire+(Ramp/[(1+A/(1+(s/p))] \quad \text{Equation 5}$$

wherein Zamp is the looking-in impedance of buffer 420 as noted above,

Ramp is the open-loop output resistance of buffer 420

Rwire is the resistance of track/wiring from the output of buffer amplifier 420 to the output terminal 152, as noted above, (resistor 430 of FIG. 4 representing the sum of (Ramp and Rwire, as note above), The term A/(1+(s/p)) represents the variation of the open loop gain ('A' being the value at DC) of buffer 420 with frequency, p representing the 3 db bandwidth of the open loop gain due to the significant pole of buffer 420.

At low frequencies, the looking-in impedance would approximately equal (Rwire+Ramp/A), As frequency increases, the looking-in impedance increases, and may be simplified to:

$$Zamp=Rwire+s^{*} [Ramp/(A/p)] \quad \text{Equation 6}$$

The value of Lamp may be determined from (equals) the term [Ramp/(A/p)].

Equation 4 may be satisfied by proper selection of C450.

In practice, additional metal resistances may be added to make total resistance of the first and second paths equal, to account for process/temperature variations. For example, assuming each of R430 and R440 approximately equals 0.1 ohms, two additional resistors each of about 1 ohm may be added, one each in the first and second signal paths, so hat the total resistance remains substantially equal across process and temperature variations.

Thus, by using components satisfying the relationship/properties described above, reference voltage source 150 may provide constant voltage (Vref) to gain block of FIG. 3 (as well as the other blocks shown in FIG. 1) irrespective of the digital codes generated by the circuit of FIG. 4. Accordingly, the digital codes may accurately reflect the voltage on path 101/111.

A reference voltage source implemented according to the present invention may be incorporated in several devices/systems, as described next with an example.

8. System/Device

Figure 9:
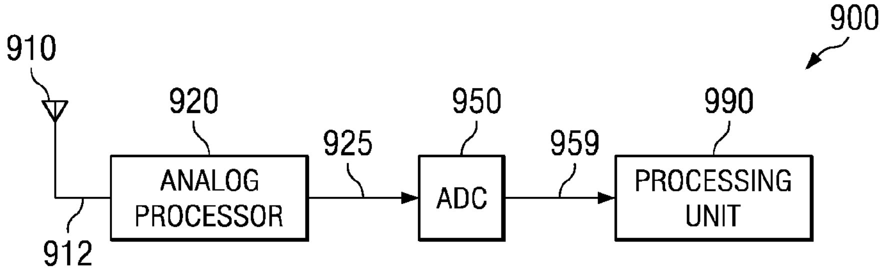
FIG. 9 is a block diagram of a device/system in which several aspects of the present invention can be implemented.

FIG. 9 is a block diagram of receiver system 900 illustrating an example system in which several aspects of the present invention may be implemented. Receiver system 900, which may correspond to, for example, a mobile phone is shown containing antenna 910, analog processor 920, ADC 950, and processing unit 990. Each component is described in further detail below.

Antenna 910 may receive various signals transmitted over a wireless medium. The received signals may be provided to analog processor 920 on path 912 for further processing. Analog processor 920 may perform tasks such as amplification (or attenuation as desired), filtering, frequency conversion, etc., on received signals and provides the resulting signal on path 925.

ADC 950 converts the analog signal received on path 925 to corresponding digital codes. ADC 950 may be implemented as a pipeline ADC and may contain a reference voltage source that provides a constant reference voltage despite load variations, as described above. However, ADC 950 may be implemented using other techniques (e.g., SAR ADC, in which case the entire ADC may be viewed as containing a single stage).

ADC 950 provides the digital codes to processing unit 990 on path 959 for further processing. Processing unit 990 receives the recovered data to provide various user applications (such as telephone calls, data applications).

9. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A voltage source providing a reference voltage on an output terminal, wherein the output terminal is coupled to a load, the voltage source comprising:

a voltage generator to provide a voltage signal at a first node;

a first signal path between the first node and the output terminal, wherein the voltage signal is provided via the first signal path to the output terminal, and wherein the first path has a first impedance; and a second signal path between the output terminal and a reference terminal, wherein the second path has a second impedance, and wherein the first and second impedances are arranged to have an effective impedance across the output terminal and the reference terminal that is independent of frequency of signals at the output terminal, and wherein the voltage source maintains the output voltage at a generally constant strength despite changes in values of the load.

2. The reference voltage source of claim 1, wherein the first impedance is generally equivalent to a first resistance and a first inductance connected in series, and wherein the second impedance is generally equivalent to a second resistance and a first capacitance connected in series, and wherein the first inductance represents the inductance of the voltage generator in operation, and wherein the first resistance represents a resistance of the first path, and wherein the first resistance is generally equal to the second resistance, and a first time constant of the first impedance is generally equal to a second time constant of the second impedance.

3. An analog to digital converter (ADC) comprising:

a stage to generate a digital value representing a strength of an input signal based on a comparison with a reference voltage; and a voltage source providing the reference voltage on an output terminal, wherein the output terminal is coupled to a load contained in the stage, the voltage source including:

a voltage generator to provide a voltage signal at a first node;

a first signal path between the first node and the output terminal, wherein the voltage signal is provided via the first signal path to the output terminal, and wherein the first path has a first impedance; and a second signal path between the output terminal and a reference terminal, wherein the second path has a second impedance, and wherein the first and second impedances are arranged to have an effective impedance across the output terminal and the reference terminal that is independent of frequency of signals at the output terminal, and wherein the voltage source maintains the reference voltage at a generally constant strength despite changes in values of the load.

4. The ADC of claim 3, wherein the first impedance is generally equivalent to a first resistance and a first inductance connected in series, and wherein the second impedance is generally equivalent to a second resistance and a first capacitance connected in series, and wherein the first inductance represents the inductance of the voltage generator in operation, and wherein the first resistance represents a resistance of the first path, and wherein the first resistance is generally equal to the second resistance, and a first time constant of the first impedance is generally equal to a second time constant of the second impedance.

5. The ADC of claim 4, wherein the ADC is a pipeline ADC comprising a plurality of stages including the stage.

6. The ADC of claim 5, wherein the stage comprises:

an operational amplifier;

a feedback capacitor across an input terminal and an output terminal of the operational amplifier;

a flash ADC to convert the input signal to a coarse digital code;

a plurality of switches; and a plurality of sampling capacitors connected to the input signal in one phase, some of the plurality of sampling capacitors being connected to the reference voltage in another phase to offer the load, wherein the operational amplifier, the feedback capacitor, the plurality of switches and the plurality of sampling capacitors are operable to generate a residue signal representing a difference of the input signal and a strength represented by the coarse digital code.

7. A device comprising:

a processing unit to process a first plurality of digital values; and an analog to digital converter (ADC) to generate the first plurality of digital values respectively representing a strength of an input signal at a corresponding plurality of time instances, the ADC including:

a stage to generate a digital value representing a strength of the input signal based on a comparison with a reference voltage; and a voltage source providing the reference voltage on an output terminal, wherein the output terminal is coupled to a load contained in the stage, the voltage source including:

a voltage generator to provide a voltage signal at a first node;

a first signal path between the first node and the output terminal, wherein the voltage signal is provided via the first signal path to the output terminal, and wherein the first path has a first impedance; and a second signal path between the output terminal and a reference terminal, wherein the second path has a second impedance, and wherein the first and second impedances are arranged to have an effective impedance across the output terminal and the reference terminal that is independent of frequency of signals at the output terminal, and wherein the voltage source maintains the reference voltage at a generally constant strength despite changes in values of the load.

8. The device of claim 7, wherein the first impedance is generally equivalent to a first resistance and a first inductance connected in series, and wherein the second impedance is generally equivalent to a second resistance and a first capacitance connected in series, and wherein the first inductance represents the inductance of the voltage generator in operation, and wherein the first resistance represents a resistance of the first path, and wherein the first resistance is generally equal to the second resistance, and a first time constant of the first impedance is generally equal to a second time constant of the second impedance.

9. The device of claim 8, wherein the ADC is a pipeline ADC comprising a plurality of stages including the stage.

10. The device of claim 9, wherein the stage comprises:

an operational amplifier;

a feedback capacitor across an input terminal and an output terminal of the operational amplifier;

a flash ADC to convert the input signal to a coarse digital code;

a plurality of switches; and a plurality of sampling capacitors connected to the input signal in one phase, some of the plurality of sampling capacitors being connected to the reference voltage in another phase to offer the load, wherein the operational amplifier, the feedback capacitor, the plurality of switches and the plurality of sampling capacitors are operable to generate a residue signal representing a difference of the input signal and a strength represented by the coarse digital code.

11. The device of claim 10, further comprising an analog processor to receive an analog signal at a first frequency and generating the input signal at a lower frequency than the first frequency, wherein the input signal at the lower frequency is processed by the ADC.

* * * * *